United States Patent
Fasano et al.

(10) Patent No.: US 10,002,835 B2
(45) Date of Patent: Jun. 19, 2018

(54) STRUCTURE FOR ESTABLISHING INTERCONNECTS IN PACKAGES USING THIN INTERPOSERS

(71) Applicant: GLOBALFOUNDRIES INC., Grand Cayman (KY)

(72) Inventors: Benjamin V. Fasano, New Windsor, NY (US); Michael S. Cranmer, Poughkeepsie, NY (US); Richard F. Indyk, Wappingers Falls, NY (US); Harry Cox, Rifton, NY (US); Katsuyuki Sakuma, Fishkill, NY (US); Eric D. Perfecto, Poughkeepsie, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days. days.

(21) Appl. No.: 15/427,156

(22) Filed: Feb. 8, 2017

(65) Prior Publication Data
US 2017/0148737 A1 May 25, 2017

Related U.S. Application Data

(62) Division of application No. 14/946,162, filed on Nov. 19, 2015, now Pat. No. 9,607,973.

(51) Int. Cl.
*H01L 23/538* (2006.01)
*H01L 23/00* (2006.01)
(Continued)

(52) U.S. Cl.
CPC ...... *H01L 23/5386* (2013.01); *H01L 23/5385* (2013.01); *H01L 24/17* (2013.01);
(Continued)

(58) Field of Classification Search
CPC ....... H01L 2224/73204; H01L 23/5384; H01L 25/0655
See application file for complete search history.

(56) References Cited

U.S. PATENT DOCUMENTS 5,251,806 A 10/1993 Agarwala et al.
9,112,049 B2 * 8/2015 Lin .................. H01L 24/13
(Continued)

OTHER PUBLICATIONS

Matijasevic, G., et al. "High Density Miltilayer Substrates Using Patterned Microvia Interposers" IEEE 393-398 (1998).
(Continued)

*Primary Examiner* — Dung Le
(74) *Attorney, Agent, or Firm* — Scully Scott Murphy and Presser

(57) ABSTRACT

A semiconductor device and a stacked pillar used to interconnect a first semiconductor die and a second semiconductor die are provided. The semiconductor device has a substrate, a splice interposer, a first semiconductor die, a second semiconductor die and first to fourth plurality of pillars. The first to fourth plurality of pillars and the splice interposer form interconnection and wiring between the first semiconductor die, the second semiconductor die and the substrate. The stacked pillar has a first conductor layer formed on a surface of the first semiconductor die, a first solder layer formed on the first conductor layer, a second conductor layer formed on the first solder layer, and a second solder layer formed on the second conductor layer. The second solder layer is heat-reflowable to attach the stacked pillar to a surface of the second semiconductor.

8 Claims, 10 Drawing Sheets

(51) Int. Cl.
*H01L 25/065* (2006.01)
*H01L 25/18* (2006.01)

(52) U.S. Cl.
CPC .......... *H01L 25/0655* (2013.01); *H01L 25/18* (2013.01); *H01L 2224/13083* (2013.01); *H01L 2224/13147* (2013.01); *H01L 2224/13155* (2013.01); *H01L 2224/1403* (2013.01); *H01L 2224/16113* (2013.01); *H01L 2224/16227* (2013.01); *H01L 2924/1432* (2013.01); *H01L 2924/1436* (2013.01)

(56) References Cited

U.S. PATENT DOCUMENTS

| | | | |
|---|---|---|---|
| 2005/0173796 A1* | 8/2005 | Pflughaupt | H01L 23/50 257/737 |
| 2005/0214971 A1* | 9/2005 | Hung | H01L 21/563 438/106 |
| 2007/0045869 A1* | 3/2007 | Ho | H01L 21/563 257/780 |
| 2012/0306073 A1* | 12/2012 | Yu | H01L 25/50 257/737 |
| 2013/0141859 A1 | 6/2013 | Roberts et al. | |
| 2014/0035131 A1* | 2/2014 | Noh | H01L 23/49811 257/737 |
| 2014/0117552 A1 | 5/2014 | Qian et al. | |
| 2014/0239494 A1* | 8/2014 | Chen | H01L 21/563 257/737 |
| 2014/0252632 A1* | 9/2014 | Barth | H01L 23/5384 257/773 |
| 2014/0264769 A1 | 9/2014 | Chen et al. | |
| 2015/0011050 A1 | 1/2015 | Chin et al. | |
| 2015/0061118 A1* | 3/2015 | Chen | H01L 24/16 257/737 |
| 2015/0318261 A1 | 11/2015 | Chung | |

OTHER PUBLICATIONS

Uematsu, Y., et al. "Hybrid Silicon and Glass Interposer for Combined Optical and Memory System-in-Package" IEEE 4 pages. (2014).

Fine Pitch Copper Pillar Flip Chip, Amkor Technology, 2003, [retrieved on Nov. 19, 2015]. Retrieved from the internet: <URL: http://www.amkor.com/go/copper-pillar-flip-chip>.

Cutting and Planarization Using a Surface Planer. Disco Corporate. [retrieved on Nov. 19, 2015]. Retrieved from the Internet: <URL: http://www.disco.co.jp/eg/solution/library/surface.html>.

Peter Salmon. Solder-free Connectors Using Buckled Pillars. Solid State Technology 2009, [retrieved on Nov. 19, 2015}. Retrieved from the Internet: <URL: <http://electroiq.com/blog/2009/01/solder-free-connectors-using-buckled-pillars/>.

* cited by examiner

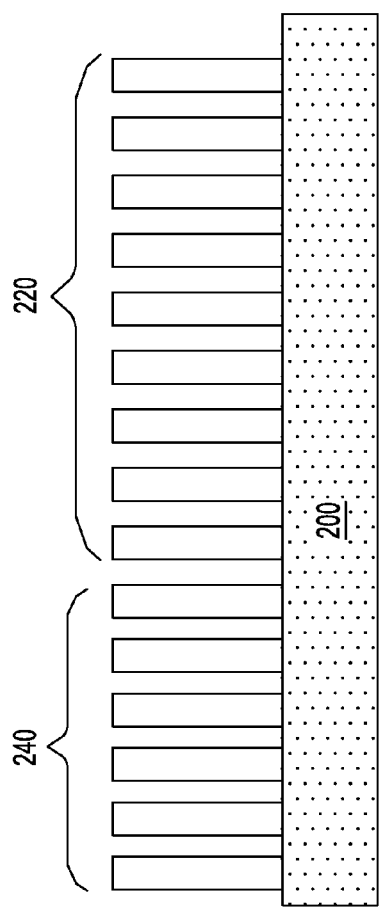
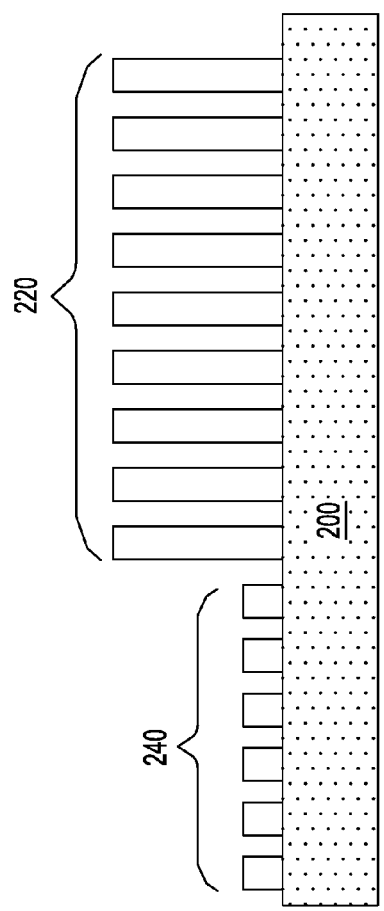

STRUCTURE FOR ESTABLISHING INTERCONNECTS IN PACKAGES USING THIN INTERPOSERS

BACKGROUND

The present disclosure and the embodiments thereof are in the field of semiconductor packages and more particularly, relate to interposer structures used to provide high density interconnects between devices at fine pitches and a method for forming semiconductor devices interconnected by the interposer structures.

To increase interconnect density of MCMs (Multi-Chip Modules), interposers based on glass and silicon have been used to provide fine pitch redistribution of wiring from the underside of a die to other devices. In many cases, these interposers are very large and many interconnections are created on both surfaces of the interposers. However, not all of these interconnections are needed, such as, pass through connections in center regions of a central die, which connections mainly are a pathway for ground and voltage busses. Furthermore, the interposers of this type need to encompass the full areas of the device, which renders manufacturing the interposers difficult. For example, the areas on an MGM, where interposers need to be provided, cover the combined areas of the CPU/GPU, the HBM/ASIC, the perimeter margins and the inter-device spacings. The production of large interposers is challenging because the interposers are excessively large and require expensive masks to make them while few interposer units per typical round wafer are produced since most interposers are square or rectangular. In addition, the interposers are integral units, which are highly sensitivity to defects on a wafer for producing the interposers.

One solution proposed to address the above issue is to provide an embedded bridge chip, which is a subsurface silicon/glass interposer that must be created inside a laminate. However, due to the embedded structure of the interposer, both the laminate and the chip require complicated processing to create a single sided interconnect between two or more devices.

Accordingly, there exists a need in the art to overcome the deficiencies and limitations described hereinabove.

SUMMARY

In one aspect of the present application, a method for interconnecting a first semiconductor die and a second semiconductor die is provided. In accordance with the method, a splice interposer is attached to a top surface of a substrate through a first plurality of pillars formed on a bottom surface of the splice interposer; the first semiconductor die is attached to the top surface of a substrate through a second plurality of pillars formed on a bottom surface of the first semiconductor die; the first semiconductor die is attached to a top surface of the splice interposer through a third plurality of pillars formed on the bottom surface of the first semiconductor, wherein the height of the second plurality of pillars is greater than the height of the third plurality of pillars; and the second semiconductor die is attached to the top surface of the splice interposer through a fourth plurality of pillars formed on a bottom surface of the second semiconductor die. The first to fourth plurality of pillars and the splice interposer form interconnection and wiring between the first semiconductor die, the second semiconductor die and the substrate.

In another aspect of the present application, a semiconductor device is provided. The semiconductor device includes a substrate having a top surface; a splice interposer having a first plurality of pillars formed on a bottom surface thereof, wherein the splice interposer is attached to the top surface of the substrate through the first plurality of pillars; a first semiconductor die having a second plurality of pillars and a third plurality of pillars formed a bottom surface of the first semiconductor die; and a second semiconductor die having a fourth plurality of pillars formed on a bottom surface of the second semiconductor die. The first semiconductor die is attached to the top surface of the substrate through the second plurality of pillars and to a top surface of the splice interposer through the third plurality of pillars. The second plurality of pillars have a first uniform height and the second plurality of pillars have a second uniform height that is smaller than the first uniform height. The second conductor die is attached to the top surface of the splice interposer through the fourth plurality of pillars. The first to fourth plurality of pillars and the splice interposer form interconnection and wiring between the first semiconductor die, the second semiconductor die and the substrate.

In still another aspect of the present application, a stacked pillar used to interconnect a first semiconductor die and a second semiconductor die is provided. The stacked pillar includes a first conductor layer formed on a surface of the first semiconductor die; a first solder layer formed on the first conductor layer; a second conductor layer formed on the first solder layer; and a second solder layer formed on the second conductor layer. The second solder layer is heat-reflowable to attach the stacked pillar to a surface of the second semiconductor die.

BRIEF DESCRIPTION OF THE DRAWINGS

FIG. 3 is a cross sectional view showing forming a plurality of pillars to a first die for forming the semiconductor device of FIG. 1.

FIG. 4 is a cross sectional view showing forming processing the plurality of pillars of FIG. 3 to provide a plurality of tall central pillars and a plurality of short peripheral pillars for forming the semiconductor device of FIG. 1.

DETAILED DESCRIPTION OF EMBODIMENTS

Figure 1:
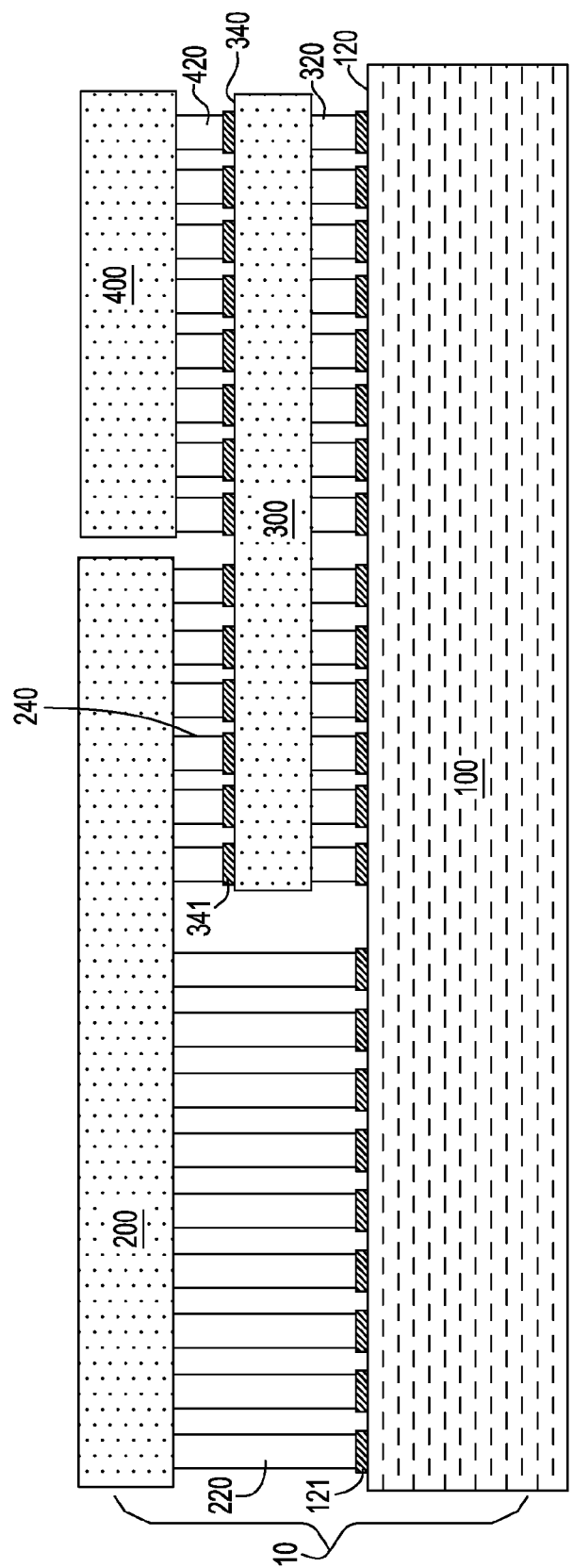
FIG. 1 is a cross sectional view of a semiconductor device in accordance with an exemplary embodiment of the present application with FIG. 1A showing an alternative embodiment.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

FIG. 1 shows a cross section view of a semiconductor device 10 according to an exemplary embodiment of the present disclosure. The semiconductor device 10 includes a substrate 100, a first die 200, a splice interposer 300 and a second die 400. The substrate 100 can be a chip carrier. The first die 200 can be a central die, such as a CPU/GPU. The second die 400 can be a peripheral die, such as a HBM (High Bandwidth Memory) module or an optical I/O module. The substrate 100 has a top surface 120, on which a plurality of metal bonding pads 121 (which are better shown in FIG. 2) can be provided. The metal bonding pads 121 can have a composition which may be comprised of, but is not limited to, Au, Pd, Cu, Ni, or alloys thereof. The splice interposer 300 is typically very thin and is attached to the top surface 120 of the substrate 100 with the metal boding pads 121 through a first plurality of pillars 320. The central portion of the first die 200 is connected to the top surface 120 of the substrate 100 with the metal bonding pads 121 through a second plurality of pillars 220. The splice interposer 300 has a top surface 340, on which a plurality of metal bonding pads 341 (which are better shown in FIG. 2) can be provided. The metal bonding pads 341 can have a composition which may be comprised of, but is not limited to, Au, Pd, Cu, Ni, or alloys thereof. The peripheral portion of the first die 200 is connected to the top surface 340 of the splice interposer 300 with the metal bonding pads 341 through a third plurality of pillars 240 that are shorter than the second pillars 220. The second die 400 is also connected to the top surface 340 of the splice interposer 300 with the metal bonding pads 341 through a fourth plurality of pillars 420. The splice interposer 300 can include through vias, chip-to-chip wiring and other mechanical support for the vias and wiring, and can have a thickness from 25 μm-100 μm. For example, the splice interposer 300 is capable of providing chip to chip interconnections, pass through signal/voltage/ground connections, and mechanical integrity between the die(s) and laminate.

Figure 1A:
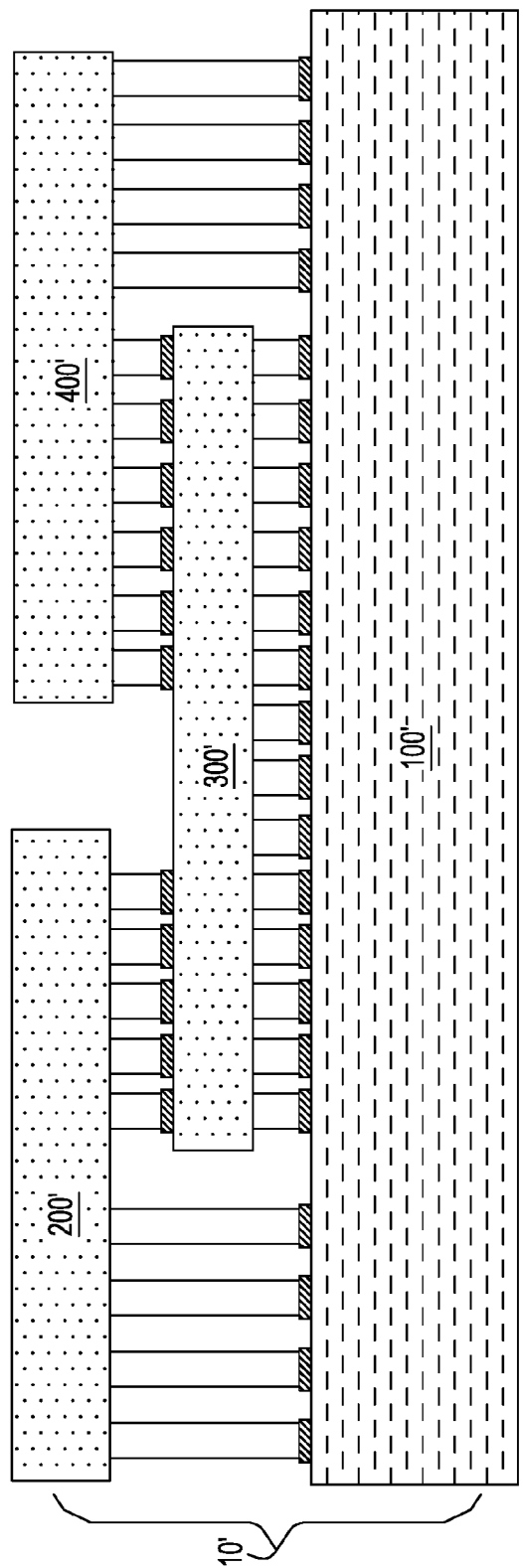

FIG. 1A schematically depicts a semiconductor device 10', which is an alternative embodiment of the semiconductor device 10. The semiconductor device 10' includes a substrate 100', a first die 200', a splice interposer 300' and a second die 400', which are joined together through a plurality of pillars that can be same or similar of the first to fourth pillars of the semiconductor device 10. However, rather than having pillars that are coplanar, the second die 400' also has stepped pillars. In this way, the second die 400' can also be joined to the top surfaces of both the splice interposer 300' and the substrate 100' through the stepped pillars. The configuration of this embodiment is particularly advantageous when two CPU/GPU dies need to be joined through the splice interposer 300' and the pillars. The configuration of this embodiment can also be expanded to include additional dies having stepped pillars.

The first pillars 320 can have a height of about 20 μm, the second pillars 220 can have a height of about 110 μm, and the third pillars 240 and the fourth pillars 420 can have a height of about 25 μm. The splice interposer and the first to fourth pillars together can provide interconnections and necessary wiring between the substrate 100, the first die 200 and the second die 400. The height of the first to fourth pillars and the splice interposer is for illustrative purpose only, and is not limited to the above specific embodiments. Other heights, which is greater than or lesser than the heights mentioned above, can also be used as the height of the splice interposer and the connecting pillars. Alternatively, the semiconductor device 10 can have a plurality of second dies 400 surrounding the first die 200. Although the interconnecting structure between the die(s) and the laminate is shown for providing interconnections at the perimeters of the semiconductor devices, the interconnecting structure can be equally applied for providing interconnections at any suitable portion of the semiconductor device, such as the central portion of the semiconductor device.

In one embodiment of the present application, the substrate 100 may comprise a semiconductor material such as, for example, silicon (Si), germanium (Ge), a silicon germanium (SiGe) alloy, a silicon carbide (SiC) alloy, a silicon germanium carbide (SiGeC) alloy, or a III/V compound semiconductor (e.g., InAs, GaAs or InP). In another embodiment of the present application, the substrate 100 may be an organic multilayer laminate or PCB. In yet another embodiment of the present application, the substrate 100 may comprise a dielectric material such as, for example, undoped glass or doped glass. In yet another embodiment of the present application, the substrate 100 may comprise a metal such as, for example, titanium (Ti), vanadium (V), chromium (Cr), manganese (Mn), iron (Fe), cobalt (Co), nickel (Ni), copper (Cu), molybdenum (Mo) and alloys, oxides and nitrides thereof.

In one embodiment of the present application, the splice interposer 300 may comprise a semiconductor material such as, for example, silicon (Si), germanium (Ge), a silicon germanium (SiGe) alloy, a silicon carbide (SiC) alloy, a silicon germanium carbide (SiGeC) alloy, or a III/V compound semiconductor (e.g., InAs, GaAs or InP). In another embodiment of the present application, the splice interposer 300 may comprise a dielectric material such as, for example, undoped glass or doped glass. In yet another embodiment of the present application, the splice interposer 300 may comprise a metal such as, for example, titanium (Ti), vanadium (V), chromium (Cr), manganese (Mn), iron (Fe), cobalt (Co), nickel (Ni), copper (Cu), molybdenum (Mo) and alloys, oxides and nitrides thereof.

Figure 2:
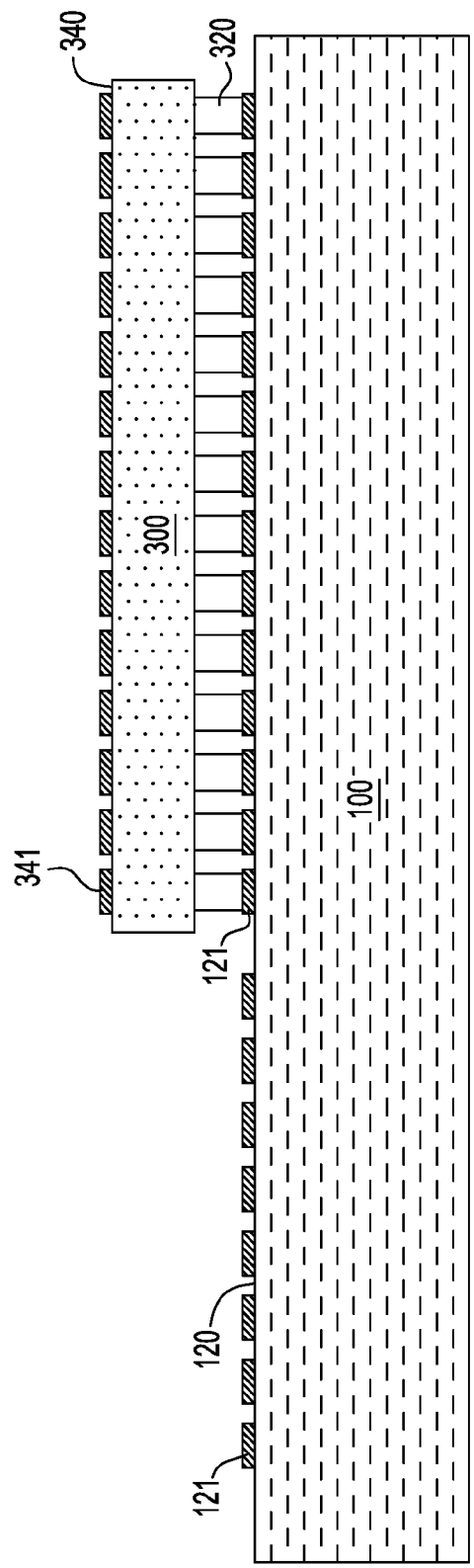
FIG. 2 is a cross sectional view showing attaching a splice interposer to a substrate for forming the semiconductor device of FIG. 1.

The semiconductor device 10 shown in FIG. 1 can be formed by first attaching the splice interposer 300 to the top surface 120 of the substrate 100 through the first pillars 320, as shown in FIG. 2. In one embodiment, before the attaching, the first pillars 320 can be formed on a surface of the splice interposer 300 through, for example, a lithographic process.

Subsequently, as shown in FIG. 3, the first die 200 (which can include a CPU/GPU) is processed to provide a plurality of pillars on a surface thereof, which surface is opposite the top surface 120 of the substrate 100 to which the first pillars 320 are attached. The plurality of pillars includes a plurality of central pillars 220 and a plurality of peripheral pillars 240, which have substantially the same height at this stage, as shown in FIG. 3. During this process, the top surface 120 of the substrate 100 and the top surfaces of the pillars can be optionally planarized. The peripheral pillars 240 are subsequently processed to reduce the height thereof, for example, by milling the peripheral pillars, as shown in FIG. 4.

Figure 5:
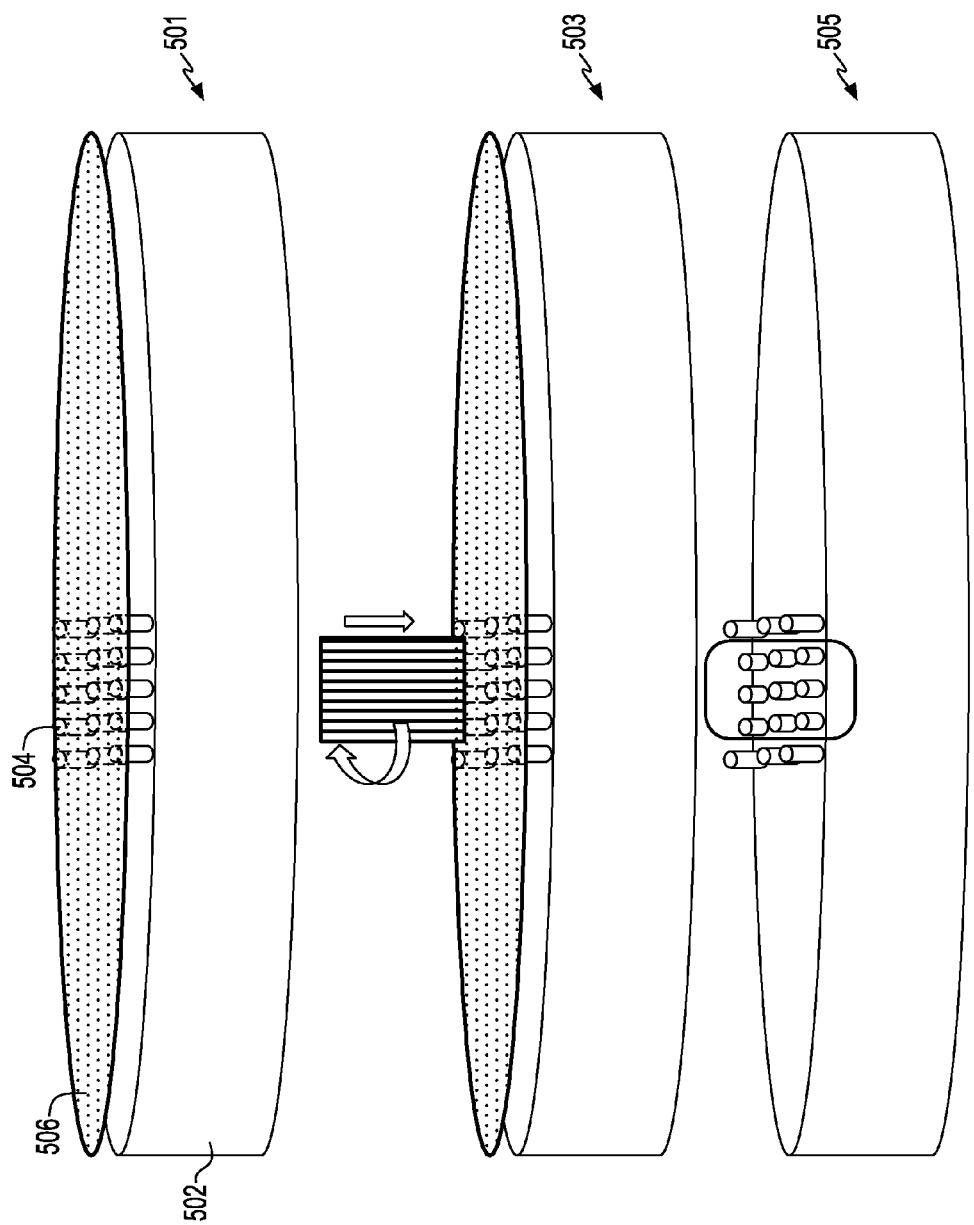
FIG. 5 is a schematic view showing the process of forming tall central pillars and short peripheral pillars to a wafer that can be used to produce the semiconductor device of FIG. 1.

In accordance with another exemplary aspect of the present application, a novel pillar structure suitable for the interposer structure as shown in FIG. 1 and a method of forming the same are also contemplated. A skilled person in the art would understand that the pillar structure and its forming method are applicable to other semiconductor structures similar to the first die 200. For this purpose, the process for forming the pillar structure will be described with respect to a general wafer 502, on the top surface of which a plurality of pillars 504 are formed, as shown in FIG. 5. In step 501, a protective support layer 506 (Which can be a polymer or wax layer) is coated on the top surface of the wafer 502 over the pillars 504, prior to a milling process. In step 503, a milling hit is utilized to reduce the height of the pillars along the edge(s) of a die that will be produced from the wafer 502, until the height of the edge pillars is reduced to a desirable height. In step 505, after the height of the edge pillars has been reduced to the desirable height, the protective support layer 506 is removed from the top surface of the wafer 502 by a method, such as solvent dissolution or thermal degradation, suitable for the specific protective support layer material employed.

Figure 6:
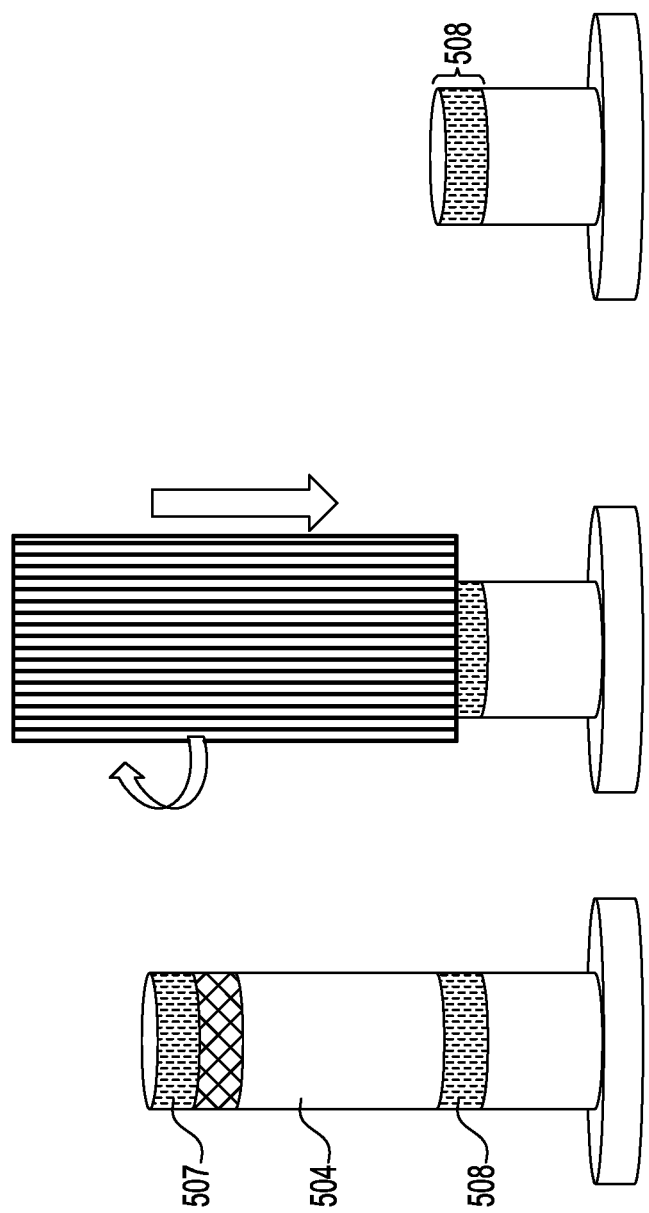
FIG. 6 is a schematic view showing the material of the pillars of FIG. 5.

FIG. 6 shows the material composition of the pillar 504. For example, the pillar 504 can be substantially made of a metal plating and includes a top solder layer 507. The pillar 504 further includes an embedded internal solder interface 508. For example, the metal plating can include deposited layers of Ni, Cu, Au, Pd, Sn, Pt and other wetting, barrier and/or diffusion layers. The solder compositions of the top solder layer 507 and the embedded internal solder interface 508 can include, for example, SnAg, Pb, SnPb, Indium, SnBi alloys and other suitable solders. In the above step 503, the milling bit is applied to reducing the height of the pillar 504 to expose the internal solder interface 508, thereby providing a so-called short stack pillar that is suitable for the interposer structure shown in FIG. 1. Both solder layers can prevent copper oxidation and improve solder wetting on corresponding device surfaces during a soldering joining process. The tall pillars and the short pillars can be formed to have planar top surfaces.

Figure 7:
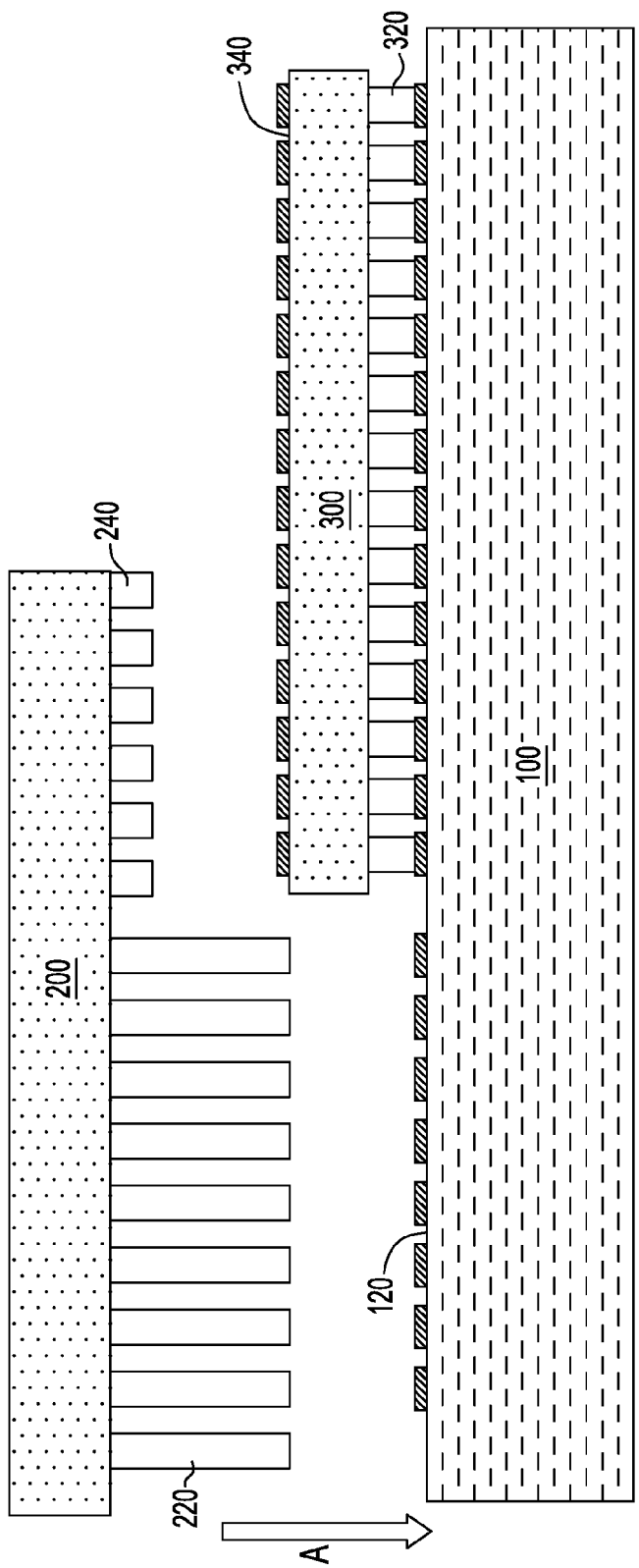
FIG. 7 is a cross sectional view showing attaching the first die to both the substrate and the splice interposer for forming the semiconductor device of FIG. 1.
Figure 8:
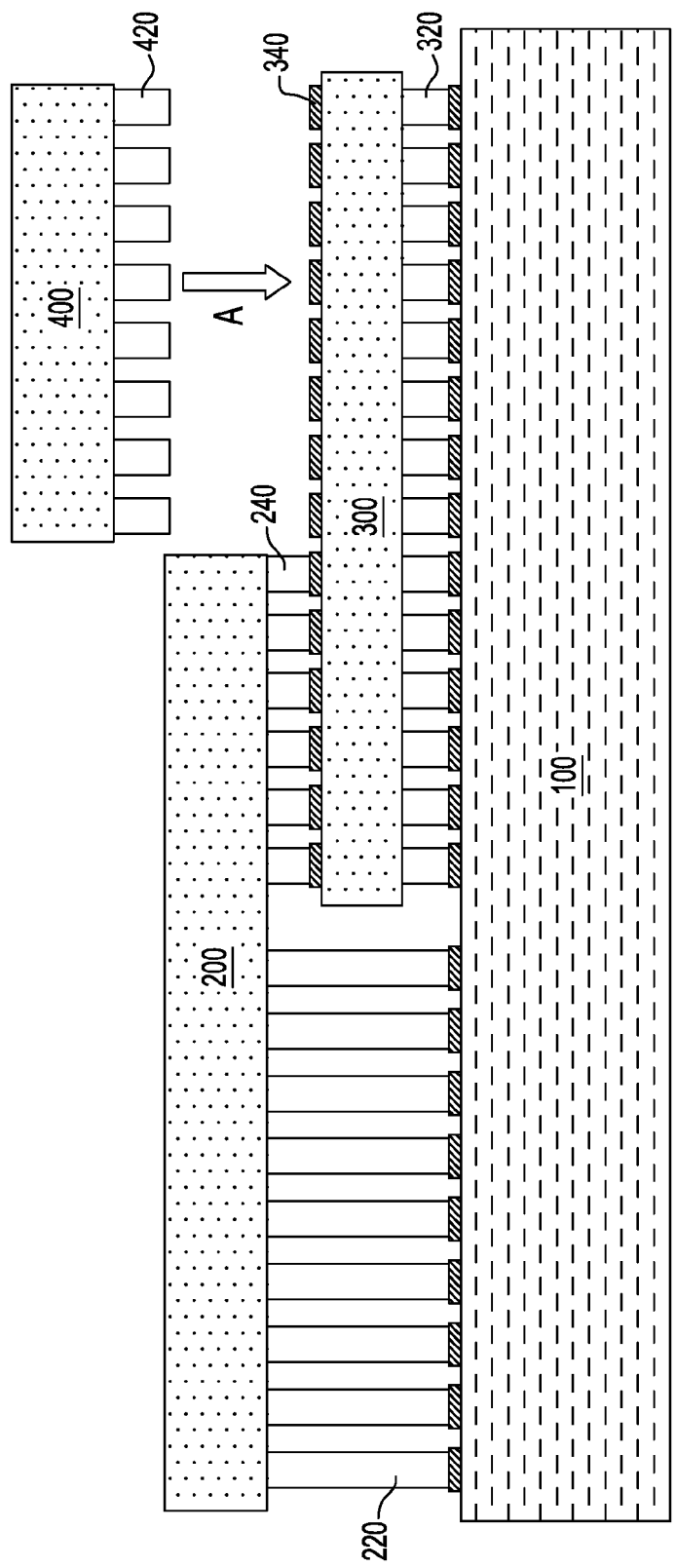
FIG. 8 is a cross sectional view showing attaching a second die to the splice interposer for forming the semiconductor device of FIG. 1.

After the first die 200 has been processed to have both tall pillars (i.e., the central pillars 220) and short pillars (i.e., the peripheral or edge pillars 240), the first die 200 is turned upside down and attached to the top surface 120 of the substrate 100 through the tall pillars and attached to the top surface 340 of the splice interposer 300 through the short pillars, respectively. FIG. 7 shows that the first die 200 being attached to the substrate 100 and the splice interposer 300 in a direction indicated by arrow A. This attaching process can be completed by heating and reflowing the solder layers of the pillars 220 and 240 of the first die 200.

Subsequently, the second die 400, which has been formed with the plurality of pillars 420, is attached to the top surface 340 of the splice interposer 300. The pillars 420 can be formed to have a top solder layer, which can be heated and reflowed to attach the second die 400 to the splice interposer 300 in the direction as shown by arrow A.

The final semiconductor device 10, as formed by the above-described steps, will be the same as shown in FIG. 1. This novel configuration offers benefits and advantages that cannot be achieved by the existing interposers, such as the silicon/glass interposer formed inside a laminate in the form of an embedded bridge chip. For example, the dimension of the interposers can be minimized, while still maintaining the density of interconnections between a CPU/GPU and its peripheral devices. Furthermore, staged tests for each modular device (such as, the splice interposer with pillars, the first die with tall and short pillars, and the second die with pillars) can be conducted separately, which effectively avoids full build defect discovery. In addition, the interconnecting structure of the semiconductor device can be applied repeatedly and recursively to the dies and/or the substrate to expand the function of the semiconductor device. For example, additional interconnecting structure and dies can be provided on the first die 200 or the second die 400, where the first die 200 or the second die 400 provides a substrate for the additional interconnecting structure and dies, without departing from the spirit of the present disclosure.

According to another exemplary aspect of the present application, a novel pillar structure having a compliant solder connection between two conductive contacts is contemplated. This novel pillar structure is applicable to any suitable interconnection structures including the first pillars 320, the second pillars 220, the third pillars 240 and the fourth pillars 420 of the semiconductor device 10 as shown in FIG. 1.

Figure 9:
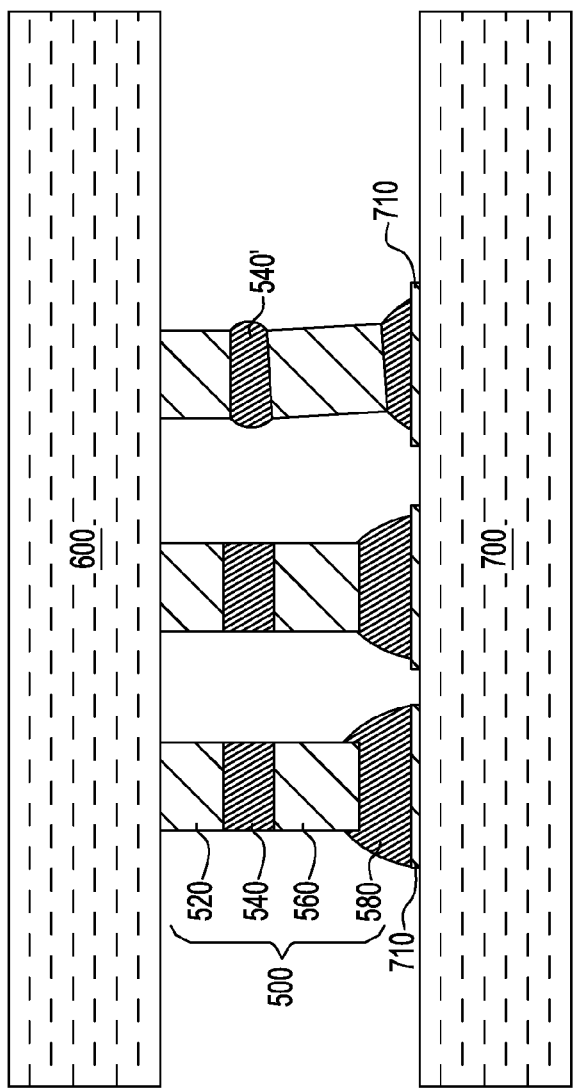
FIG. 9 is a cross sectional view of a semiconductor device including a pillar structure for interconnecting two dies, according to another exemplary embodiment of the present application.

FIG. 9 shows a pillar structure 500 according to an exemplary embodiment of the present application. The pillar structure 500 is provided between a top die 600 and a bottom die 700. The pillar structure 500 includes, from top to bottom thereof, a first conductor layer 520, a first solder layer 540 (or a mid-pillar solder layer), a second conductor layer 560 and a second solder layer 580. The pillar structure 500 can be formed by first plating the first conductor layer 520 (a rigid conductor) in the form of a pillar or stud configuration on a conductive surface of the top die 600, by using a mask or photo-defined resist. The first conductor layer 520 can be made of Cu or Ni. The first solder layer 540 is subsequently formed on the first conductor layer 520. The first solder layer 540 can be formed by using a low temperature solder, such as a Pb free Sn based metal. The second conductor layer 560 is subsequently formed on the first solder layer 540 to extend the height of the pillar structure 500 to a desirable height between the top die 600 and the bottom die 700. The second solder layer 580 can then be formed by reflow joining the exposed end of the composite metal-solder-metal conductor (i.e., the combination of the first conductor layer 520, the first solder layer 540 and the second conductor layer 560) to a conductive surface of the bottom die 700, by using a solder on the conductive surface of the second die 700; alternatively, the second solder layer 580 can be formed by plating a solder on the exposed end of the second conductor layer 560. One or more metal pads 710 can be provided on the top surface of the bottom die 700. The metal pads can have a composition which may be comprised of, but is not limited to, Au, Pd, Cu, Ni, or alloys thereof.

By having the mid-pillar solder layer 540, the pillar structure 500 provides certain flexibility and compliance, which allows the pillar structure 500 to accommodate non-planar or non-uniform height between the top die 600 and the bottom die 700 to prevent over-compressed or warped conductive surfaces. The mid-pillar solder layer 540 is capable of compressing and/or deforming to create a so-called pivot or omni-directional ball joint 540' in the conductor pillar stack. As a result, stress relief can be provided for non-planar interconnection, particularly at the corners of the top die 600 and the bottom die 700.

Furthermore, solder joint cracking/tearing which can be problematic on large, stiff interposer assemblies, can be effectively addressed by this mid-pillar solder structure.

In addition, during assembling, the second solder layer 580 would deform to increase the diameter thereof. Thus, there is an increased likelihood that the adjacent solder layers may touch, causing short circuit. However, due to the deformation of the mid-pillar solder layer 540, less deformation of the second solder layer is required. As a result, the tendency of short circuit is reduced. Moreover, since no joint stress will be transferred to the chips, pillar separation from the top die can be prevented.

In sum, the multiple solder interfaces, as embodied by the pillar structure 500, are capable of providing stress mitigation and warpage accommodation and also increased yield of the final products. Although a single middle solder layer (i.e., the first solder layer 540) has been shown and described with respect to the exemplary embodiment (i.e., the pillar structure 500), multiple middle solder layers made of same or similar material as the first solder layer 540 can be included in the pillar structure, without departing from the spirit of the present disclosure. The plating steps for producing the first conductor layer 520 and the first solder layer 540 can be repeated to produce the pillar structure having multiple middle solder layers.

Figure 10:
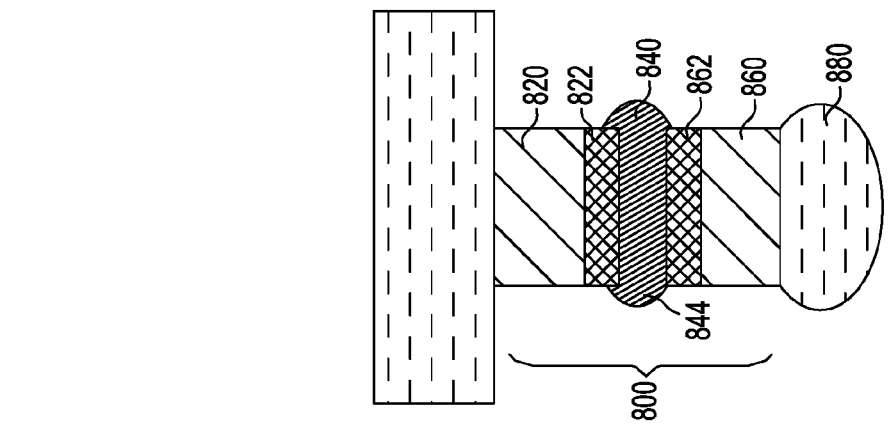
FIG. 10 is an enlarged partial cross sectional view of a semiconductor device including a pillar structure for interconnecting two dies, according to yet another exemplary embodiment of the present application.
Figure 11:
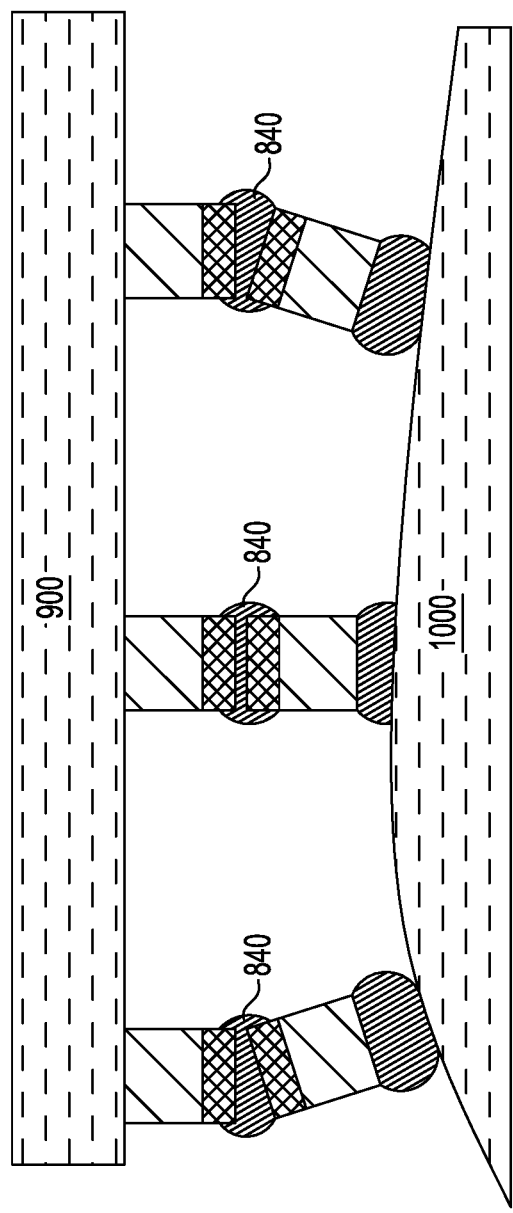
FIG. 11 is a cross sectional view of a semiconductor device including a plurality of the pillar structures shown in FIG. 10, when the plurality of the pillar structures are being used for interconnecting two dies.

FIG. 10 shows a pillar structure 800 according to another exemplary embodiment of the present application. The pillar structure 800 is similarly provided between two dies. The pillar structure 800 includes, from top to bottom thereof, a first conductor layer 820, a solder elbow 840 (or a mid-pillar solder layer in the shape of an elbow), a second conductor layer 860 and a joining solder 880 (a bottom solder layer). For example, the solder elbow 840 can have a circumferential portion 844, which extends beyond the circumference of both the first conductor layer 820 and the second conductor layer 860 when viewed from a sectional perspective. In an embodiment, a first Ni layer 822 can be provided between the first conductor layer 820 and the solder elbow 840 and a second Ni layer 862 can be provided between the second conductor layer 860 and the solder elbow 840, for minimizing inter-metallic formation at the solder elbow 840. As shown in FIG. 10, the circumferential portion 844 can have a cross section in the shape of a half sphere that partially covers the first Ni layer 822 and the second Ni layer 862. In an embodiment, the first conductor layer 820 and the second conductor layer 860 can be made of Cu; and the solder elbow 840 can have a melting temperature lower than that of Cu and a solidification temperature lower than that of the joining solder 880. FIG. 11 shows application of a plurality of pillar structures 800 between a top die 900 and a bottom die 1000, wherein the top surface of the bottom die 1000 is shown as non-planar as an example. As shown, the pillar structure 800 can adapt to a curvature of the top die and/or the bottom die by deforming the solder elbow 840. The pillar structure 800 can achieve the advantages of the pillar structure 500, as described previously.

While the present application has been particularly shown and described with respect to various embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor device, comprising
a substrate having a top surface;
a splice interposer having a first plurality of pillars formed on a bottom surface thereof, wherein the splice interposer is attached to the top surface of the substrate through the first plurality of pillars;
a first semiconductor die having a second plurality of pillars and a third plurality of pillars formed a bottom surface of the first semiconductor die, wherein the first semiconductor die is attached to the top surface of the substrate through the second plurality of pillars and to a top surface of the splice interposer through the third plurality of pillars, wherein the second plurality of pillars have a first uniform height and the third plurality of pillars have a second uniform height that is smaller than the first uniform height; and
a second semiconductor die having a fourth plurality of pillars formed on a bottom surface of the second semiconductor, wherein the second semiconductor die is attached to the top surface of the splice interposer through the fourth plurality of pillars,
wherein the first to fourth plurality of pillars and the splice interposer form interconnection and wiring between the first semiconductor die, the second semiconductor die and the substrate.

2. The semiconductor device of claim 1, wherein the second plurality of pillars are formed at a central portion of the bottom surface of the first semiconductor die and the third plurality of pillars are formed at a peripheral portion of the bottom surface of the first semiconductor.

3. The semiconductor device of claim 1, wherein the first semiconductor die comprises at least one of a CPU and a GPU and the second semiconductor die comprises at least one of a HBM, an optical I/O and an additional CPU or GPU.

4. The semiconductor device of claim 1, wherein the top surface of the substrate and the top surface of the splice interposer are planarized.

5. The semiconductor device of claim 1, wherein the first to fourth plurality of pillars comprise at least one stacked pillar formed on a corresponding surface of the first semiconductor die, the second semiconductor die or the splice interposer,
wherein the stacked pillar comprises a first conductor layer formed on the corresponding surface, a first solder layer formed on the first conductor layer, a second conductor layer formed on the first solder layer and a second solder layer formed on the second conductor layer.

6. The semiconductor device of claim 5, wherein the first conductor layer and the second conductor layer are formed from Cu,
wherein the first solder layer has a melting temperature lower than the melting temperature of Cu, and
wherein the first solder layer has a solidification temperature lower than the solidification temperature of the second solder layer.

7. The semiconductor device of claim 6, wherein a first Ni layer is provided between the first conductor layer and the first solder layer and a second Ni layer is provided between the second conductor layer and the first solder layer,
  wherein the first solder layer comprises a circumferential portion extending beyond the circumference of the first Ni layer and the second Ni layer, and
  wherein, when viewed through a cross section view, the circumferential portion of the first solder layer is substantially half-spherical to at least partially cover a side surface of the first Ni layer and a side surface of the second Ni layer.

8. A stacked pillar used to interconnect a first semiconductor die and a second semiconductor die, comprising:
  a first conductor layer formed on a surface of the first semiconductor die;
  a first solder layer formed on the first conductor layer;
  a second conductor layer formed on the first solder layer; and
  a second solder layer formed on the second conductor layer, wherein the second solder layer is heat-reflowable to attach the stacked pillar to a surface of the second semiconductor,
  wherein the first conductor layer and the second conductor layer are formed from Cu,
  wherein the first solder layer has a melting temperature lower than the melting temperature of Cu,
  wherein the first solder layer has a solidification temperature lower than the solidification temperature of the second solder layer,
  wherein a first Ni layer is provided between the first conductor layer and the first solder layer and a second Ni layer is provided between the second conductor layer and the first solder layer,
  wherein the first solder layer comprises a circumferential portion extending beyond the circumference of the first Ni layer and the second Ni layer, and
  wherein, when viewed from a sectional perspective of the stacked pillar, the circumferential portion of the first solder layer is substantially half-spherical to at least partially cover a side surface of the first Ni layer and a side surface of the second Ni layer.

* * * * *